United States Patent
Weihs et al.

(10) Patent No.: US 6,991,855 B2
(45) Date of Patent: Jan. 31, 2006

(54) REACTIVE MULTILAYER FOIL WITH CONDUCTIVE AND NONCONDUCTIVE FINAL PRODUCTS

(75) Inventors: Timothy P. Weihs, Baltimore, MD (US); Omar Knio, Timonium, MD (US); Michael Reiss, Baltimore, MD (US); David van Heerden, Baltimore, MD (US)

(73) Assignee: Johns Hopkins University, Baltimore, MD (US)

( * ) Notice: Subject to any disclaimer, the term of this patent is extended or adjusted under 35 U.S.C. 154(b) by 0 days.

(21) Appl. No.: 10/761,439

(22) Filed: Jan. 21, 2004

(65) Prior Publication Data

US 2004/0151939 A1 Aug. 5, 2004

Related U.S. Application Data

(62) Division of application No. 09/846,846, filed on May 1, 2001, now Pat. No. 6,736,942.
(60) Provisional application No. 60/201,292, filed on May 2, 2000.

(51) Int. Cl.
*B32B 7/00* (2006.01)

(52) U.S. Cl. .................. 428/607; 428/615; 428/635; 428/650; 428/652; 428/656; 428/680; 428/924; 428/926; 428/941
(58) Field of Classification Search ................ 428/607, 428/615, 635, 650, 652, 656, 680, 924, 926, 428/941
See application file for complete search history.

(56) References Cited

U.S. PATENT DOCUMENTS

| | | |
|---|---|---|
| 3,705,373 A | 12/1972 | Cameron |
| 3,729,046 A | 4/1973 | Kennedy et al. |
| 4,454,379 A | 6/1984 | Cleveland et al. |
| 4,778,649 A | 10/1988 | Niino et al. |
| 4,836,982 A | 6/1989 | Brupbacher et al. |
| 4,889,745 A | 12/1989 | Sata |
| 4,909,842 A | 3/1990 | Dunmead et al. |
| 4,990,180 A | 2/1991 | Halverson et al. |
| 5,062,025 A | 10/1991 | Verhoeven et al. |
| 5,093,148 A | 3/1992 | Christodoulou et al. |
| 5,217,816 A | 6/1993 | Brupbacher et al. ........ 428/614 |
| 5,266,132 A | 11/1993 | Danen et al. |
| 5,381,944 A | 1/1995 | Makowiecki et al. |

(Continued)

OTHER PUBLICATIONS

U.S. Appl. No. 10/247,998, filed Sep. 20, 2002, Timothy P. Weihs et al.*
L. Battezati et al., "Solid State Reactions in Al/Ni Alternate Foils Induced By Cold Rolling and Annealing," Acta Mater., vol. 47, No. 6, pp. 1904–1914 (1999). (no month given).
T . Weihs, "Self–Propagating Reactions in Multilayer Materials," Handbook of Thin Film Process Technology, pp. F7:1–F7:13 (1997) (no month given).

*Primary Examiner*—Robert R. Koehler
(74) *Attorney, Agent, or Firm*—Lowenstein Sandler PC

(57) ABSTRACT

Reactive foils and their uses are provided as localized heat sources useful, for example, in ignition, joining and propulsion. An improved reactive foil is preferably a freestanding multilayered foil structure made up of alternating layers selected from materials that will react with one another in an exothermic and self-propagating reaction. Upon reacting, this foil supplies highly localized heat energy that may be applied, for example, to joining layers, or directly to bulk materials that are to be joined. This foil heat-source allows rapid bonding to occur at room temperature in virtually any environment (e.g., air, vacuum, water, etc.). If a joining material is used, the foil reaction will supply enough heat to melt the joining materials, which upon cooling will form a strong bond, joining two or more bulk materials.

1 Claim, 6 Drawing Sheets

U.S. PATENT DOCUMENTS

| | | |
|---|---|---|
| 5,490,911 A | 2/1996 | Makowiecki et al. |
| 5,491,003 A | 2/1996 | Akahira |
| 5,527,442 A | 6/1996 | Sekhar et al. |
| 5,538,795 A * | 7/1996 | Barbee, Jr. et al. ......... 428/615 |
| 5,606,146 A | 2/1997 | Danen et al. |
| 5,773,748 A | 6/1998 | Makowiecki et al. |
| 5,786,129 A | 7/1998 | Ellis |
| 5,913,256 A | 6/1999 | Lowden et al. |
| 6,203,892 B1 | 3/2001 | Matsumura et al. |
| 6,203,897 B1 | 3/2001 | Koizumi et al. ............ 428/336 |

* cited by examiner

REACTIVE MULTILAYER FOIL WITH CONDUCTIVE AND NONCONDUCTIVE FINAL PRODUCTS

CROSS REFERENCE TO RELATED APPLICATIONS

This application is a divisional of prior U.S. application Ser. No. 09/846,486 filed on May 1, 2001 now U.S. Pat. No. 6,736,942, which is a non-provisional application that claims the benefit of U.S. Provisional Application Ser. No. 60/201,292, filed by the present applicants on May 2, 2000 and entitled "Reactive Multilayer Foils". Application Ser. No. 09/846,486 is related to U.S. application Ser. No. 09/846,447, now U.S. Pat. No. 6,534,194, filed May 1, 2001 and U.S. application Ser. No. 09/846,422, filed May 1, 2001. All of the documents cited in this section are incorporated herein by reference.

GOVERNMENT INTEREST

This invention was made with government support under NSF Grant Nos. DMR-9702546 and DMR-9632526 and The Army Research Lab/Advanced Materials Characterization Program through Award No. 019620047. The government has certain rights in the invention.

FIELD OF THE INVENTION

This invention relates to reactive multilayer foils, especially freestanding multilayer foils, useful as local heat sources.

BACKGROUND OF THE INVENTION

Reactive multilayer coatings are useful in a wide variety of applications requiring the generation of intense, controlled amounts of heat in a planar region. Such structures conventionally comprise a succession of substrate-supported coatings that, upon appropriate excitation, undergo an exothermic chemical reaction that spreads across the area covered by the layers generating precisely controlled amounts of heat. While we will describe these reactive coatings primarily as sources of heat for welding, soldering or brazing, they can also be used in other applications requiring controlled local generation of heat such as propulsion and ignition.

In many methods of bonding or joining materials, a heat source is required. This heat source may either be external or internal to the structure to be joined. When external, the heat may be generated from a device such as a furnace. Processes incorporating such heat sources require the heating of the entire unit to be bonded, including the bulk materials and the bond material, to a temperature high enough to melt the bond material. Such a method presents problems because the bulk materials to be joined are often delicate or sensitive to the high temperatures required in the process. These high temperatures may damage the materials to be bonded.

To alleviate the problems associated with external heat sources, internal heat sources are utilized. These heat sources often take the form of reactive powders or even electrical wires. When reactive powders are used, a mixture of metals or compounds that will react exothermically in a self-propagating reaction to form a final compound or alloy is utilized. Such processes have existed since self-propagating powders were developed in the early 1960s, spawning what is known as Self-Propagating, High-Temperature Synthesis (SHS). SHS reactions, however, often require substantial preheating to self-propagate, and controlling the rate and manner in which their energy is released is often difficult. As a result, bonding may be inconsistent or insufficient.

To combat the problems associated with reactive powder bonding, multilayer structures comprised of materials, which allow similar exothermic reactions, have been developed. Such structures allow for more controllable and consistent heat generating reactions. The basic driving force behind such SHS reactions is a reduction in atomic bond energy. When a structure having a series of layers of reactive material (known as a foil) is ignited, heat is produced as the distinct layers atomically combine. This heat ignites adjacent regions of the foil, thereby allowing the reaction to travel the entire length of the structure, generating heat until all material is reacted. Even with such advances in bonding technology, however, there remain problems. Many materials, for example, posed major difficulties and previously could not be successfully bonded. Additionally, methods utilizing reactive foils as heat sources often resulted in the foil debonding from the substrate upon reaction, thereby weakening the bond. Accordingly there is a need for improved reactive multilayer foils.

SUMMARY OF THE INVENTION

Reactive foils and their uses are provided as localized heat sources useful, for example, in ignition, joining and propulsion. An improved reactive foil is preferably a freestanding multilayered foil structure made up of alternating layers selected from materials that will react with one another in an exothermic and self-propagating reaction. Upon reacting, this foil supplies highly localized heat energy that may be applied, for example, to joining layers, or directly to bulk materials that are to be joined. This foil heat-source allows rapid bonding to occur at room temperature in virtually any environment (e.g., air, vacuum, water, etc.). If a joining material is used, the foil reaction will supply enough heat to melt the joining materials, which upon cooling will form a strong bond, joining two or more bulk materials. If no joining material is used, the foil reaction supplies heat directly to at least two bulk materials, melting a portion of each bulk, which upon cooling, form a strong bond. Additionally, the foil may be designed with openings that allow extrusion of the joining (or bulk) material through the foil to enhance bonding.

BRIEF DESCRIPTION OF THE DRAWINGS

Many advantages, features, and applications of the invention will be apparent from the following detailed description of preferred embodiments of the invention, which is provided in connection with the accompanying drawings. In the drawings.

It is to be understood that these drawings are for the purpose of illustrating the concepts of the invention and are not to scale.

DETAILED DESCRIPTION

Preferred embodiments and applications of the invention will now be described. Other embodiments may be realized and compositional or structural changes may be made without departing from the spirit or scope of the invention. Although the embodiments disclosed herein have been particularly described as joining or bonding bulk materials utilizing a freestanding, self-propagating reactive foil structure, it should be readily apparent that the invention may be embodied for other uses or applications requiring an intense localized heat source.

Figure 1:
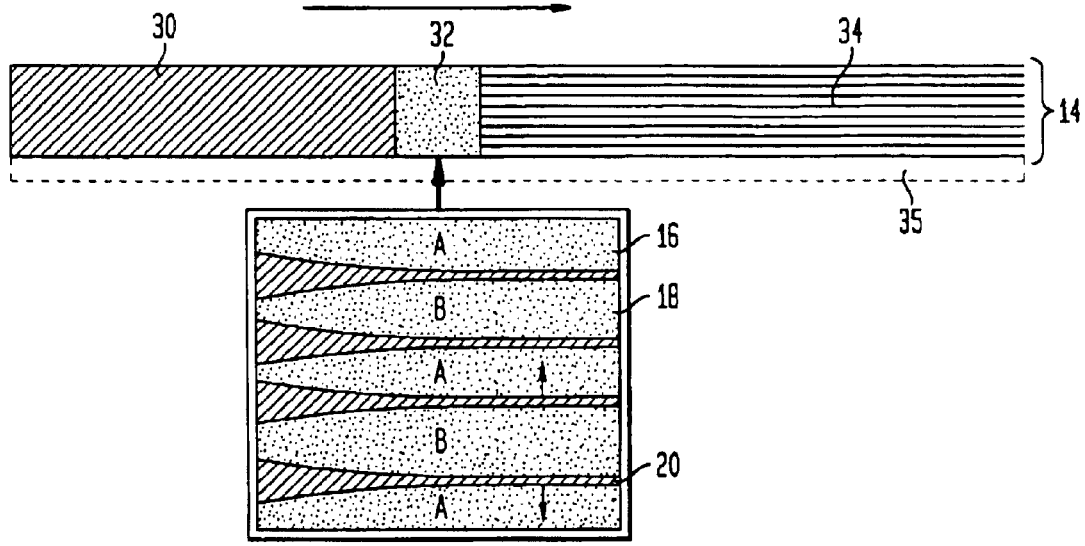
FIG. 1 illustrates an exemplary multilayer reactive foil during reaction.

In accordance with a preferred embodiment of the invention, a multilayer reactive structure (generically referred to herein as a "foil") is provided as a local heat source in a variety of applications such as a process for joining two or more (of the same or different) materials together. As illustrated in FIG. 1, reactive multilayer foil 14 is made up of alternating layers 16 and 18 of materials A and B, respectively. These alternating layers 16 and 18 may be any materials amenable to mixing of neighboring atoms (or having changes in chemical bonding) in response to a stimulus, including silicides (e.g., Rh/Si, Ni/Si, and Zr/Si, etc.), aluminides (e.g., Ni/Al, Ti/Al, Monel/Al, and Zr/Al, etc.), borides (e.g. Ti/B), carbides (e.g., Ti/C), thermite reacting compounds (e.g., Al/Fe$_2$O$_3$ or Al/Cu$_2$O), alloys, metallic glasses, and composites (e.g., metal ceramic).

The materials (A/B) used in fabrication of the reactive foil are preferably chemically distinct. In a preferred embodiment, layers 16, 18 alternate between a transition metal (e.g., Ti, Ni, etc.) and a light element (e.g., B, Al, etc.). Preferably, the pairs (A/B) of elements are chosen based on the way they react to form stable compounds with large negative heats of formation and high adiabatic reaction temperatures, as described in T. P. Weihs, "Self-Propagating Reactions in Multilayer Materials," *Handbook of Thin Film Process Technology,* 1997, which is incorporated herein by reference in its entirety. In a preferred embodiment, at least one of the layers of the reactive foil is (or contains) Al.

When a multilayer foil 14 is exposed to a stimulus (e.g., spark, energy pulse, etc.), for example at one end, neighboring atoms from materials A and B mix, e.g. as shown in region 30. The change in chemical bonding caused by this mixing results in a reduction in atomic bond energy, thus generating heat in an exothermic chemical reaction. This change in chemical bonding occurs as layers with A—A bonds (i.e., layer 16) and layers with B—B bonds (i.e., layer 18) are exchanged for A–B bonds, thereby reducing the chemical energy stored in each layer, and generating heat. As FIG. 1 further illustrates, this generated heat diffuses through foil 14 (in a direction from reacted section 30 through reaction zone 32 to unreacted section 34) and initiates additional mixing of the unreacted layers. As a result, a self-sustaining/self propagating reaction (SHS reaction) is produced through foil 14. With sufficiently large and rapid heat generation, the reaction propagates across the entire foil 14 at velocities typically greater than 1 m/s As the reaction does not require additional atoms from the surrounding environment (as, for example, oxygen in the case of combustion), the reaction makes foil 14 a self-contained source of energy capable of emitting bursts of heat and light rapidly, reaching temperatures above 1400 K, and a local heating rate reaching 10$^9$ K/s. This energy is particularly useful in applications (e.g., joining, ignition, etc.) requiring production of heat rapidly and locally.

When a reaction propagates across a multilayer foil 14 as illustrated by FIG. 1, the maximum temperature of the reaction is typically located at the trailing edge of the reaction zone 32. This may be considered the final temperature of reaction, which can be determined by the heat of reaction ($\Delta H_{rx}$), the heat lost to the environment or surrounding material ($\Delta H_{env}$), the average heat capacity of the sample ($C_p$), and the mass of the sample, M. Another factor in determining the final temperature is whether or not the reaction temperature exceeds the melting point of the final product. If the melting point is exceeded, then some heat is absorbed in the state transformation from solid to liquid of the product. The final temperature of reaction may be determined using the following formulas (where $T_o$ is the initial temperature, $\Delta H_m$ is the enthalpy of melting, $T_m$ is the melting temperature of the product, and there is no reaction with the surrounding environment or material), depending upon whether final product melting occurs:

$T_f = T_o - (\Delta H_{rx} + \Delta H_{env})/(C_p M)$ If no melting of final product occurs;

$T_f = T_m$ If there is a two-phase region of solid and liquid final product; and $T_f = T_o - (\Delta H_{rx} + \Delta H_{env} + \Delta H_m)/(C_p M)$ If the final product completly melts.

Intricately related to the heat of the foil reaction is the velocity of the propagation of the reaction along the length of foil 14. The speed at which the reaction can propagate depends on how rapidly the atoms diffuse normal to their layering (FIG. 1) and how rapidly heat is conducted along the length of foil 14. The propagation velocity is a strong function of the thicknesses of the individual layers in the multilayer foil. As the thickness of individual layers 16, 18 decreases, the diffusion distances are smaller and atoms can mix more rapidly. Heat is released at a higher rate, and therefore the reaction travels faster through the foil structure.

In accordance with a preferred embodiment of the invention, reactive multilayer foils 14 may be fabricated by physical vapor deposition (PVD) methods. A magnetron sputtering technique, for example, may be used to deposit the materials A/B on a substrate (shown in FIG. 1 in dashed outline form as layer 35) as alternating layers 16, 18. Substrate 35 may be rotated over two sputter guns in a manner well known in the art to effectuate the layering of materials A/B into alternating layers 16, 18.

Substrate 35 is shown in dashed outline form to indicate that it is a removable layer that facilitates fabrication of the reactive foil 14 as a freestanding foil. Substrate 35 may be any substrate (e.g., Si, glass, or other underlayer) having the characteristics of providing sufficient adhesion so as to keep the foil layers on the substrate during deposition, but not too adhesive to prevent the foil from being removed from the substrate following deposition. The substrate can include a coating of release material or adhesion material to fine tune its adhesion characteristics.

Advantageously an additional wetting layer (e.g., tin) may be used as an interface layer between the first layer of foil (16 or 18) and the substrate 35 to provide the necessary adhesive. When no wetting layer is employed, selection of the appropriate material A/B as the first layer deposited on the substrate will ensure that the necessary adhesive requirements are met. When a reactive foil using Al/Monel as materials A/B is to be fabricated, for example, without a wetting layer, the exemplary reactive foil would be deposited on a substrate such as Si with the first layer being Al deposited on the substrate. Al is preferably selected as the first layer in such case because Al will sufficiently adhere to Si during depositing, but will allow peeling off of the substrate after the foil is formed.

A fabricated foil 14 may have hundreds to thousands of alternating layers 16 and 18 stacked on one another. Individual layers 16 and 18 preferably have a thickness ranging from 1–1000 nm. In a preferred embodiment, the total thickness of foil 14 may range from 10 $\mu$m to 1 cm.

Another method of fabricating is to deposit material in a codeposition geometry. Using this method, both material sources are directed onto one substrate and the atomic fluxes from each material source are shuttered to deposit the alternate layers 16 and 18. An alternative method is to eliminate shuttering altogether and rotate substrates over two material sources that have physically distinct atomic fluxes. With this method, each pass over a source preferably generates an individual layer.

Preferably the degree of atomic intermixing of materials A/B that may occur during deposition should be minimized. This may be accomplished by depositing the multilayers onto cooled substrates, particularly when multilayers 16 and 18 are sputter deposited. To the extent that some degree of intermixing is unavoidable, a relatively thin (as compared to the alternating unreacted layers) region of pre-reacted material 20 will be formed. Such a pre-reacted region 20, nevertheless, is helpful in that it serves to prevent further and spontaneous reaction in foil 14.

In an alternative embodiment, a multilayer reactive foil may be fabricated using mechanical techniques such as repeated rolling of layered composites.

As illustrated in FIG. 1, the preferred reactive foil 14 is a freestanding multilayer reactive foil for particular use as a heat-generating source. Freestanding foils are easier to characterize than thin films because they can be handled like "bulk" samples. Making reactive foils 14 freestanding greatly expands their possible uses. Because such reactive foils are not necessarily associated with any particular application, they may be mass-produced for any purpose requiring a self-propagating localized heat source. Their production is not limited or impeded by placing large or delicate items into a vacuum chamber to be coated by a reactive multilayer foil. Moreover, freestanding foils will allow heat sinking to the substrate to be minimized where unwanted.

Figure 3:
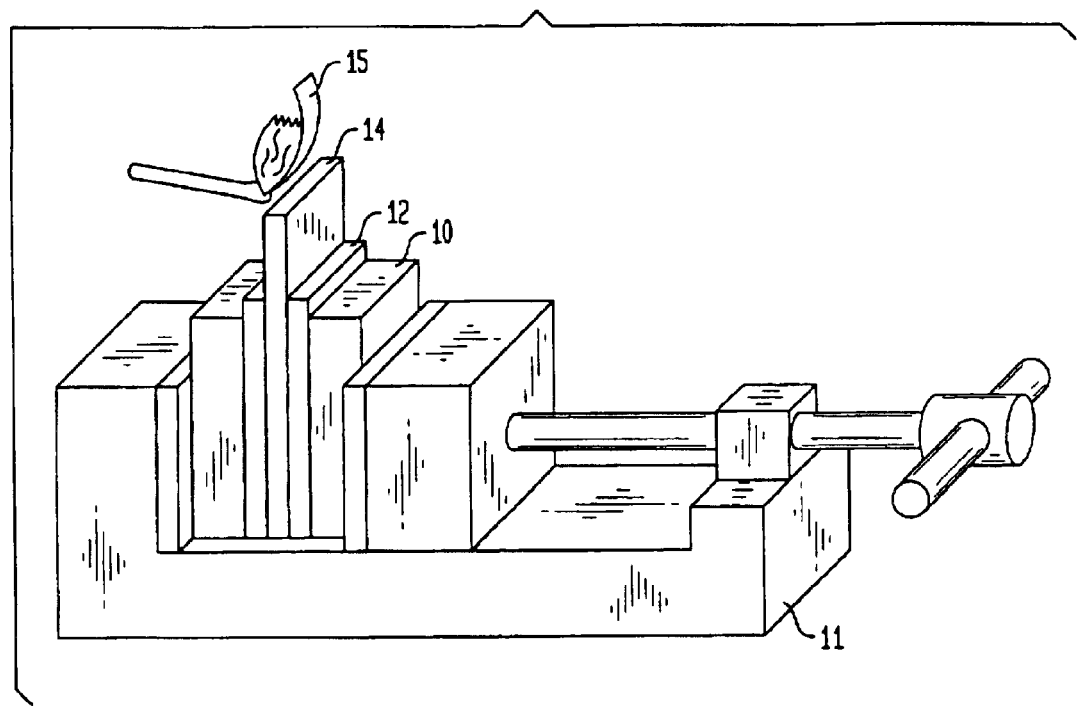
FIG. 3 illustrates initiation of a joining application.

Freestanding foils in accordance with preferred embodiments of the invention may be adapted for use in a variety of applications. For example, the freestanding foils may be used to couple bodies of materials (referred to herein as "bulk materials") together to form a unified product. Freestanding foils may find use in any number of bonding, soldering, brazing, welding or other applications to join bulk materials. A typical joining application is represented in FIG. 3, in which two or more bulk materials 10 are to be joined together. The bulk materials 10 may be ceramics, metallic glasses, metals/alloys, polymers, composites, semiconductors, and other forms of material.

In the particular joining application illustrated in FIG. 3, joining material 12 is used to join bulk materials 10 together. Joining material 12 may be any layer (or composite layer) of material to be melted to join bulk materials 10 together. Joining material 12 can be in the form of freestanding sheets made up of metallic glasses, metals/alloys, functionally graded layers, Ni—B films, solder, brazes, self-propagating braze, combinations of such, or other like joining materials.

In accordance with a preferred embodiment of the invention, a reactive foil 14 is positioned between joining materials 12 to form a structure somewhat like a sandwich. The reactive foil "sandwich" thus formed is preferably positioned between bulk materials 10 at the location (e.g., end point, joint, intersection, etc.) at which the bulk materials 10 are to be joined together.

Alternatively, a reactive foil 14 is positioned between bulk materials 10 which have previously been coated with joining materials 12.

As another alternative, a reactive foil 14 is positioned between joining materials 12 to form a structure somewhat like a sandwich. The reactive foil "sandwich" thus formed is preferably positioned between bulk materials 10 at the location (e.g., end point, joint, intersection, etc.) at which the bulk materials 10 are to be joined together. The bulk materials are first coated with joining materials.

The joining process involves the application of force (as symbolically represented by vice 11 in FIG. 3) to maintain the relative positions of bulk materials 10, joining materials 12, and reactive foil 14. Advantageously all components are freestanding elements pressed together. In an alternative embodiment, joining materials 12 are pressed as a composite with reactive foil 14.

Once the components of the joining process are positioned, a stimulus (shown as lighted match 15) is applied, preferably, to one end of reactive foil 14 to initiate an SHS reaction. The intermixing of atoms within reactive foil 14 produces rapid and intense heat sufficient to melt joining materials 12 along the entire length of reactive foil 14. In this state, joining materials 12 are sufficient to join bulk materials 10 together. Shortly thereafter, the joined materials 10 return to the temperature of the environment (e.g., room temperature) and can be removed from the applied force (graphically represented by vice 11).

A composite structure composed of joining materials 12 and reactive foil 14 can be formed through deposition (e.g., vapor depositing) of reactive foil 14 onto one layer of joining material 12. Another layer of joining material is then combined with reactive foil 14 through vapor deposition or an application of force (e.g., cold rolling).

Advantageously a wetting/adhesion layer may be added to facilitate surface wetting for the reactive foil 14, bulk materials 10, or both. The wetting/adhesion layer allows uniform spreading of joining material to ensure consistent joining of bulk materials. The wetting/adhesion layer may be a thin layer of joining material (e.g., braze), Ti, Sn, metallic glass, etc. Commercial alloys such as Ag—Sn, Ag—Cu—Ti, Cu—Ti, Au—Sn, and Ni—B may also be used.

Preferred embodiments of the invention are useable as freestanding reactive foils 14 with increased total thickness. The total thickness of such a reactive foil depends upon the thickness and number of the elemental layers (e.g., 16 and 18) utilized to form the foils. Foils that are less than 10 $\mu$m are very hard to handle as they tend to curl up on themselves. Foils on the order of 100 $\mu$m are stiff, and thus, easily handled. Thicker foils also minimize the risk of a self-propagating reaction being quenched in the foils. In joining applications using reactive foils, there is a critical balance between the rate at which the foil generates heat and the rate at which that heat is conducted into the surrounding braze layers and the joint to be formed. If heat is conducted away faster than it is generated, the reaction will be quenched and the joint cannot be formed. The thicker foils make it harder to quench the reaction because there is a larger volume generating heat and the same surface area through which heat is lost.

Thicker foils can be utilized with reaction temperatures that are lower, generally leading to more stable foils. Foils with high formation reaction temperatures are generally unstable and brittle and therefore are dangerous and difficult to use. Brittle foils, for example, will crack easily, leading to local hot spots (through the release of elastic strain energy and friction) that ignite the foil. Cutting such brittle foils (e.g., for specific joint sizes) is very difficult to do as they are more likely to crack into unusable pieces or igniting during the cutting process. Freestanding thick foils offer the advantage of overcoming problems associated with thermal shock and densification problems that have presented obstacles in known processes. Both phenomena relate to rapid changes in the dimensions of the foils. On reacting, the foils will heat rapidly and will try to expand beyond the substrate that constrains them. This leads to a thermal shock and foils that are deposited on substrates can debond, thereby causing inconsistent and less effective bonding. As the reaction proceeds, the foils will also densify, due to the change in chemical bond. This densification, can also cause debonding from a substrate and inconsistent and ineffective bonding. By making the foil freestanding in accordance with a preferred embodiment of the invention, no debonding occurs, the foil is easily manipulated and handled, and thus the reactive foil is made available to a greater variety of applications.

In accordance with a preferred embodiment, the thicker reactive foils are on the order of 50 $\mu$m to 1 cm thick. Although a number of different systems may be employed to create the thick freestanding reactive foils, a unique process in selecting the fabrication conditions for the employed system should be carefully selected. For example, deposition conditions such as sputter gas and substrate temperature are advantageously chosen so that stresses remain sufficiently low in the films of the foil as they are grown in the system. Since the stress in the film times its thickness scales with the driving force for delamination, the product of stress and thickness should be kept below 1000 N/m. Stresses often arise in the films during the fabrication process. As the films grow thicker, they are more likely to peel off their substrates or crack their substrates than thinner films, thereby ruining the final foil production. By characterizing the stresses in the films and selecting conditions to minimize the stresses, the fabrication process can be completed without the premature peeling off of the foil or the cracking of the substrate.

In an alternative embodiment, openings in a reactive foil are intentionally designed in the foil structure. These openings are of particular use in facilitating and enhancing joining applications.

Figure 4:
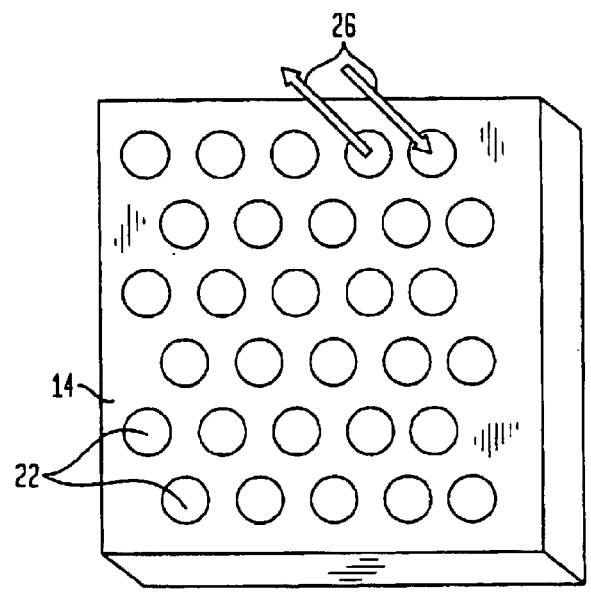
FIG. 4 shows an exemplary perforated reactive foil.

The foil may be initially fabricated, for example, with one or more openings or perforations 22 through the foil structure, as shown in FIG. 4. Preferably the openings are formed in a periodic pattern, such as a rectangular array, across the foil area. Any known method may be employed to create openings. For example, sputter depositing of the foil 14 on a removable substrate with patterned holes may be used. The openings may also be formed by depositing the foil 14 onto a substrate, depositing photoresist on the foil, patterning the photoresist with photolithography, and then etching the underlying foil through the patterned holes. A further exemplary technique involves physically punching holes in foil 14. Preferably the openings have effective diameters in the range of 10–10,000 micrometers. (The effective diameter of a non-circular opening is the diameter of a circular opening of equal area.)

As shown in FIG. 4, the openings in foil 14 allow joining material 12, or bulk material 10 in some circumstances, to extrude (as shown by arrows 26) through these perforations 22 upon being heated and melted by the exothermic reaction of foil 14. Upon this extrusion, one layer of joining material 12, or bulk material 10, may contact and couple with another layer 12, or bulk material 10, on the opposite side of the freestanding foil 14. The patterned perforations 22 permit enhanced bonding of bulk materials 10 to reactive foil 14 and each other making stronger and more consistent bonds.

Figure 5:
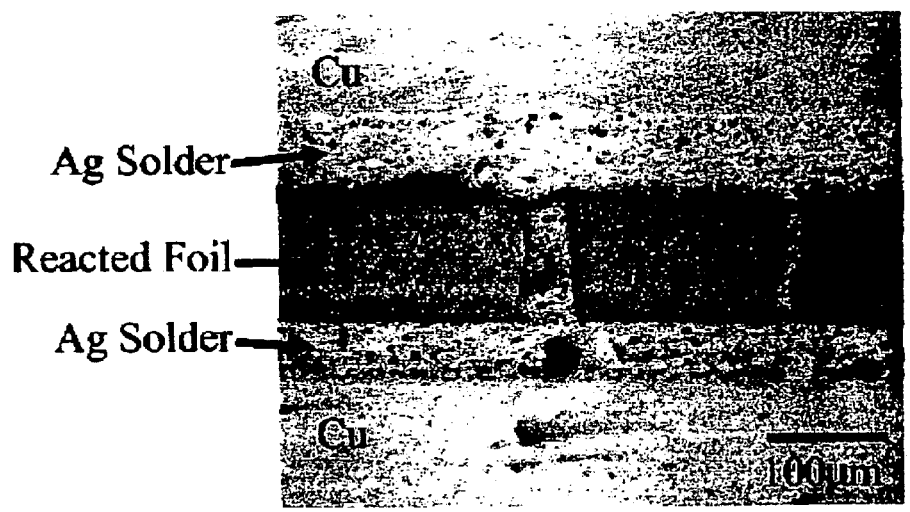
FIG. 5 depicts the flow of joining material through holes in a foil.

FIG. 5 is a microphotograph showing two copper bodies 53, 54 bonded by silver solder 50 that has extruded through openings, e.g. 51 in a reacted foil 52.

Utilizing one or more embodiments of the invention, a number of different applications can now be performed more effectively and efficiently. For example, metallic glass bulk materials can now be joined, where the end product is a single structure made up solely of metallic glass, including the bond and reacted foil layer. It is also now possible to join bulk materials with very different chemical compositions, thermal properties, and other physical properties, that historically presented many difficulties in bonding. Semiconductor or microelectronic devices may be bonded to circuit boards or other structures, and at the same time, multiple leads may be created that are intricately associated with the devices. Semiconductor and microelectronic devices may also be sealed hermetically.

These joining applications are enhanced by the invention in that potential for heat damage, normally associated with such applications as soldering, brazing, and welding, is avoided or at least minimized.

Moreover, utilizing embodiments of the invention, the bulk materials being joined may be freestanding. This means that prior to the actual joining of the bulk materials, the individual bulk substrates do not need any braze layer deposited directly upon them. Additionally, the bulk substrates do not necessarily require any pre-bonding of the reactive foil or other pre-treatment. The bulk materials involved may simply be held securely to either a freestanding braze layer or the freestanding reactive foil at the time of bonding for a strong and permanent joint to be created.

Embodiments of the invention allow bonding at least one bulk that is a metallic glass. No braze need be associated with that bulk in the joining process. This is because the reactive foil may be designed to bond directly with a metallic glass upon reaction. To accomplish this joining process, the reactive foil can itself react to form a metallic glass.

Embodiments of the invention further allow for superior bonding when the bulk materials include microchips or semiconductor devices. In the bonding of semiconductor devices to a substrate such as a circuit board, potential for damage to the device is a factor that must be taken into consideration. By using a freestanding reactive foil to join such a semiconductor device to a substrate, little heat is generated that can be damaging to the device or to adjacent components. The semiconductor devices may be situated on the substrate with greater freedom and ease. As described below, specific foil compositions, such as Ni/Al or Monel/Al, may be utilized. Foils of such composition are not only far easier to handle than those of the past, but the combination of Ni, Cu and Al enables freestanding foils to have a high thermal and electrical conductivity.

When bonding is directed to bulk materials such as semiconductor devices, the reactive foil may have composition patterning properties. The embodiments allow the fabrication of alternating adjacent electrically insulating and conducting regions in the final reacted foil, thereby allowing a multitude of leads to be bonded and electrically isolated with a single reaction.

In a preferred embodiment of the invention, less energy is required to perform a joining application utilizing reactive foils. Functionally graded layers as joining material allow for control over melting temperatures through selection of their composite materials. Functionally graded layers may be utilized, for example, because their melting temperature may be controlled. Ni—B films used as joining material allow for low temperature melting where the melting temperature begins at a relatively low temperature and elevates as B diffuses out of Ni, resulting in a final material with a relatively high melting point. By requiring less energy from the foil reaction, the overall heat applied to the total structure to be bonded can be reduced, thereby minimizing damage to the materials to be bonded due to the foil reaction.

In another embodiment, one may include layers of reactive multilayer braze within the reactive multilayer foil. For example, in a foil comprising reactive layers of Al and reactive layers of Ti, Zr or Hf alloys, one may include one or more reactive braze layers comprising a Cu or a Ni alloy. The reactive multilayer braze would provide an energy source as the layers mix and form the joining material, in addition to the energy provided by the reactive foil. The combination of reactive multilayer foil and reactive multilayer brazes permits the use of reactive brazes that may not self-propagate without the foil.

EXAMPLES

The invention may now be more clearly understood by consideration of the following specific examples:

Example 1

Figure 6:
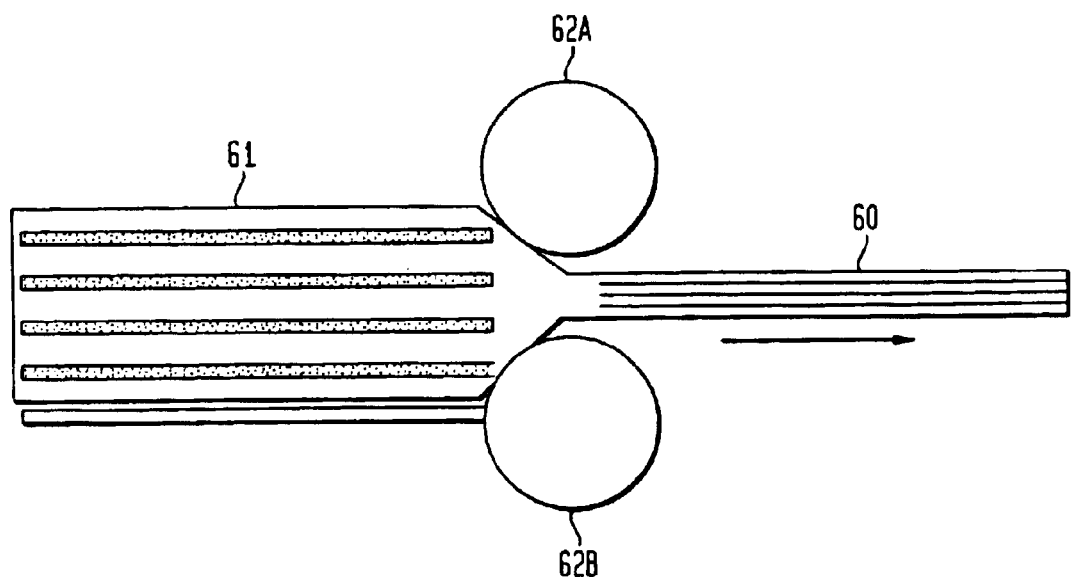
FIG. 6 illustrates formation of a reactive foil by cold rolling.

Reactive foils of Al and Ni are formed by cold rolling many 5 μm sheets of Ni and Al that are stacked together. FIG. 6 schematically illustrates fabrication of the foil 60 by passage of the stack 61 between rollers 62A and 62B. The sheets can be cold-rolled several times until the layers are reduced to the desired thickness.

Example 2

Figure 7:
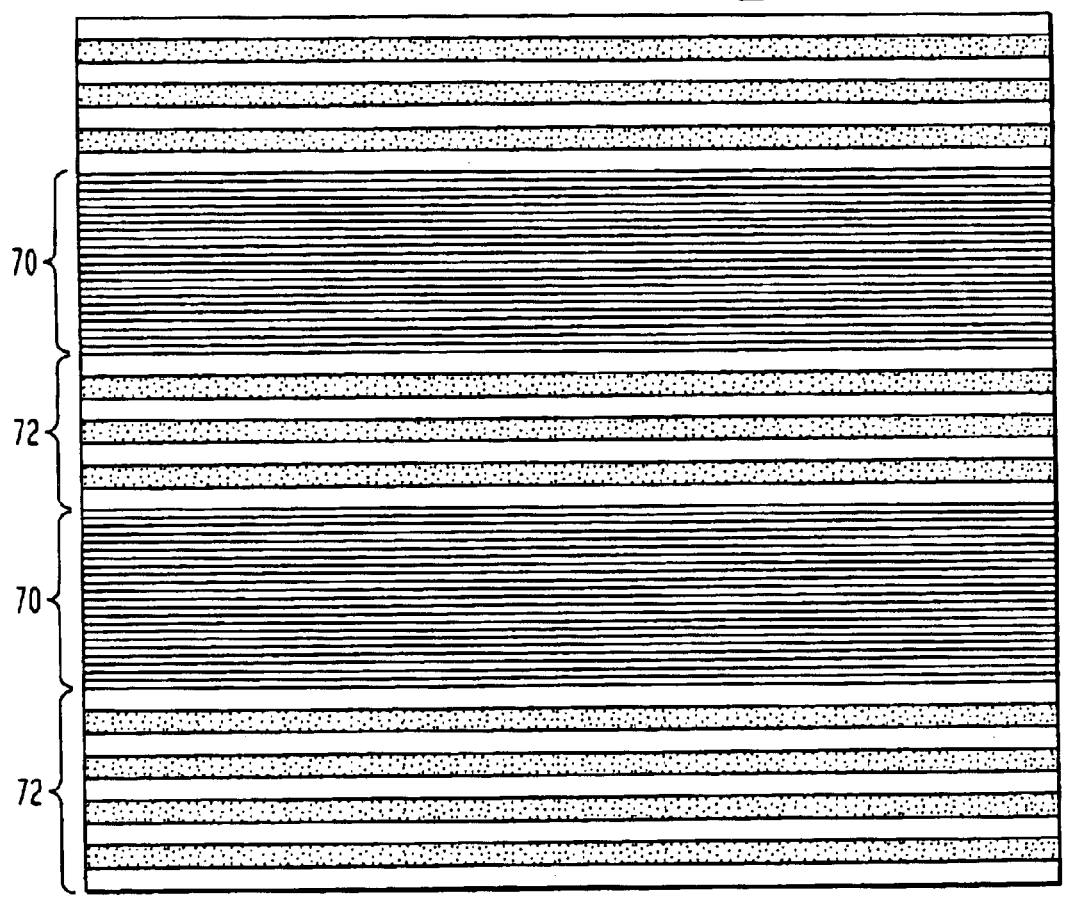
FIG. 7 is a schematic cross section of a composite reactive foil composed of sets of microlaminate foils and nanolaminate foils.

Instead of utilizing foils comprised of multilayers of uniform thickness, a composite foil is used, in which nanolaminate reactive multilayers are deposited onto reactive microlaminate foils. As illustrated in FIG. 7 certain sections of layers 70 within the reactive foil 71 will be of a nanoscale (nanolaminate), while other sections 72 will be of micron-thick layers (microlaminate). The nanolaminate, as described above, will react easily and the reaction, once started, will self-propagate along the length of the foil without being quenched by the melting of the surrounding braze layers or bulk components. Thus, the nanolaminate can be viewed as an igniter for the microlaminate. The section 72 with microscale layers may not be able to sustain a self-propagating reaction at room temperature, but when heated by adjacent nanolaminate sections 70, it will sustain such a reaction. The foil can comprise alternate layers of Al and Ni.

Example 3

In fabricating these composite foils, sheets of Al and Ni are rolled to form the microlaminate section and then a nanolaminate foil is vapor deposited onto either side of this microlaminate structure. Fabrication may also be performed through vapor deposition of the full composite with the microlaminate layers deposited at much higher rates without igniting the foil or causing unacceptable intermixing between the alternating layers during deposition.

Example 4

A reactive multilayer braze is formed that is similar to the reactive foils described above, which reacts to form a metallic glass. This multilayer braze gives off heat upon a reaction of its alternating layers. Through a careful selection of reactants that are know to be good glass formers, the braze will form an amorphous final product upon reaction, similar to those in commercial use and to the foils described above. The heat generated by the reacting braze layers reduces the amount of reactive foil required for joining.

Example 5

Certain compositions of foil 14 may react to form amorphous alloys (metallic glass). Those foils may be combinations of layers of alloys that comprise Ni or Cu, alloys that comprise Ti, Zr, or Hf, and alloys that comprise Al as such will react to form metallic glass. When using such foils, certain properties may be attained. Metallic glasses have very good wetting capabilities. The braze layer may be excluded when using such a foil to join bulk metallic glass and in such a circumstance, once the foil reacts and is joined with the metallic glass, a single bulk metallic glass may be produced.

Example 6

Figure 8:
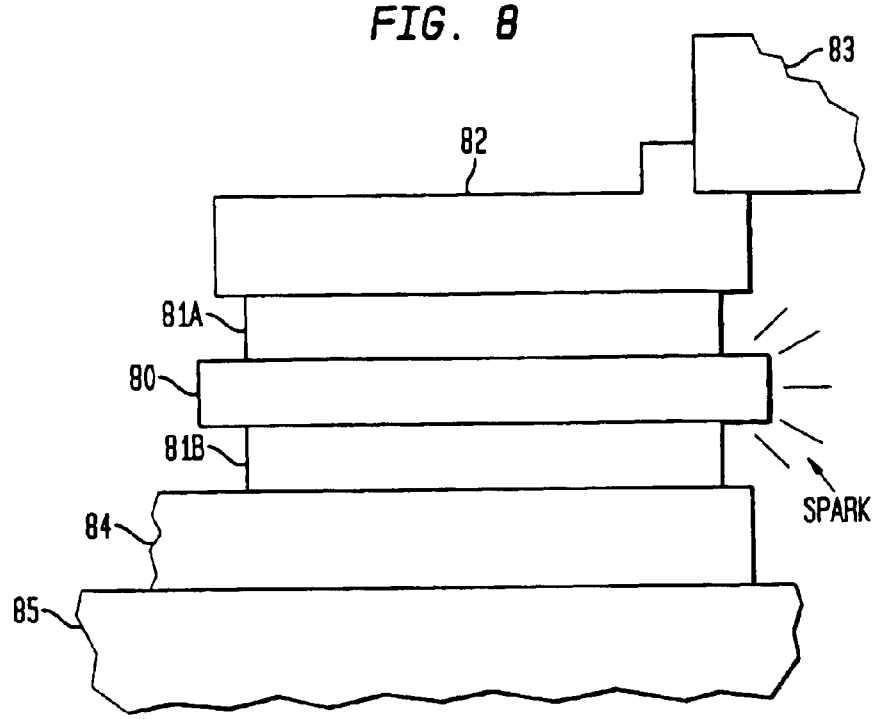
FIG. 8 shows the use of reactive foil to join a semiconductor or microelectronic device to a substrate.

A semiconductor or microelectronic device is joined to a substrate such as a printed circuit board using a reactive multi-layer foil. FIG. 8 schematically illustrates the joining arrangement wherein the reactive foil 80 is sandwiched between solder layers 81A and 81B, and the sandwich is disposed between the contact lead 82 for the device 83 and the contact surface 84 of the board.

Example 7

A patterned reactive foil is designed so that some sections react to form electrically conductive regions and other sections form non-conductive regions.

Figure 9A:
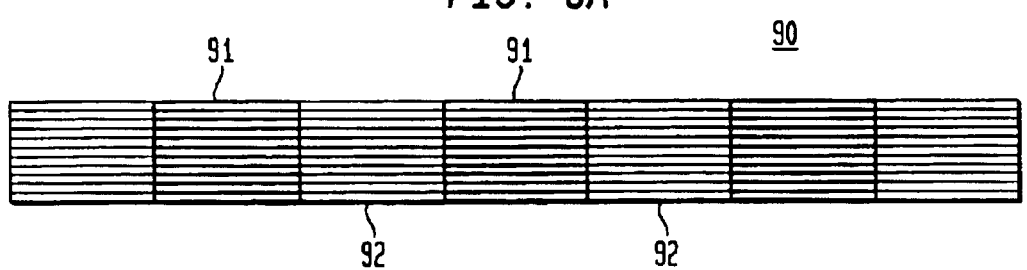
FIGS. 9A and 9B illustrate a patterned reactive foil wherein some regions react to form conductive regions and others form non-conductive regions.
Figure 9B:
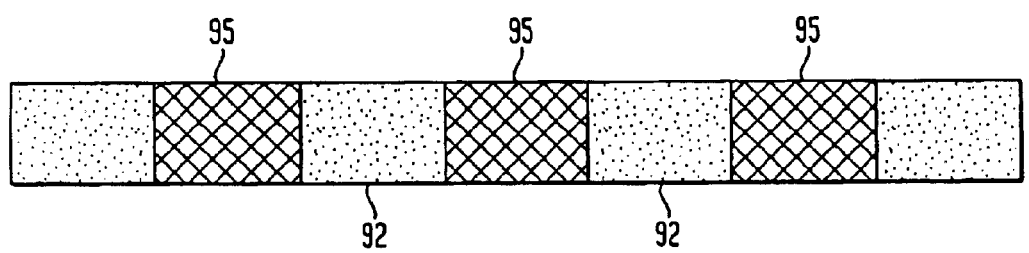

FIGS. 9A and 9B schematically illustrate the concept. FIG. 9A shows the foil 90 before reaction. FIG. 9B is after the reaction. Regions 91, comprising alternate layers of Al and Ni, react to form conductive regions 95. Regions 92, comprise insulators, such as $SiO_2$ or silicon nitride, or alternate layers that react to form non-conductive regions.

It is contemplated that in use, regions 91 would be registered between contacts above and below the foil 90 to be electrically connected through the regions 95 after the reaction.

It can now be seen that one aspect of the invention is a method of making a reactive multilayer foil composed of a plurality of alternating layers that can react exothermically. The method comprises the steps of providing a substrate, vapor depositing the alternating layers on the substrate to form the multilayer foil, and separating the multilayer foil from the substrate. Advantageously the substrate has sufficient adherence to the deposited layers to retain the layers during deposition but insufficient adherence to prevent removal of the multilayer foil after deposition. As an example, the layers can comprise one or more layers of aluminum deposited in contact with a silicon substrate. Alternatively, the substrate can include a coating of release material or an adhesion material to achieve the proper level of adherence.

One approach for separating the multilayer foil from the substrate is to provide a substrate with a sacrificial layer (or make the entire substrate a sacrificial layer) that can be etched or peeled away from the foil after deposition. Exemplary materials for a sacrificial layer include copper, brass and photoresist.

The vapor depositing of the layers is preferably by physical vapor deposition such as by magnetron sputtering or electron beam evaporation. Advantageously the substrate is cooled during the vapor depositing to reduce intermixing of the alternating layers, to reduce energy losses and to reduce stresses in the deposited layers. Advantageously the layers are deposited to form a multilayer foil having a thickness in the range 50 $\mu$m–1 cm. Foils thus made with a thickness in the range 10 $\mu$m to 1 cm can be used as freestanding foils.

Another aspect of the invention is a method of bonding a first body to a second body comprising the steps of providing a freestanding reactive multilayer foil, pressing the bodies together against the foil and igniting the reactive foil. The ignited foil can melt material of the bodies or melt an associated meltable (joining material) layer to join the bodies together. Alternatively, the reaction product of the layers can itself be the joining material. One or both of the bodies can be semiconductor or microelectronic devices. The method is particularly advantageous for joining bodies having coefficients of thermal expansion, which differ by 1 $\mu$m/° C. or more.

In an alternative embodiment, a reactive multilayer foil includes a plurality of openings through the thickness of the foil. The openings are preferably periodic over the foil area. These openings can be left unfilled or they can be filled with meltable materials, propellants, or other materials that will change or react on heating when the reactive foil is ignited.

Such apertured foils can be made by providing a substrate having a surface including a plurality of preformed openings, bumps or particles of thickness (or depth) comparable to or larger than the thickness of the multilayer foil to be deposited, depositing the reactive multilayer foil, and separating the resulting apertured multilayer foil from the substrate.

Alternatively, a reactive multilayer foil can be deposited on a substrate, patterned by a removable masking layer, and etched to form a plurality of holes. The apertured foil can then be removed from the substrate. Yet further in the alternative, a continuous foil can be formed and holes can be formed in the continuous foil by mechanical pressing.

The apertured foils have an important application in bonding. A reactive foil perforated by a plurality of openings is disposed between a first and a second body. If the body material is not meltable by the foil, a separate meltable layer or coating of meltable joining material is also disposed between the bodies. The bodies are pressed together against the foil (and joining material) and the foil is ignited to melt joining material. The melted material flows within and through the openings in the foil to join the bodies. This approach produces a characteristic joint with ductility enhancing bridges through the openings. It is especially advantageous where one or both bodies are semiconductor or microelectronic devices or where the devices have CTEs that differ by more than 1 $\mu$m/° C.

A third type of novel reactive foil is a composite reactive multilayer foil in which the individual layers in the foil differ in thickness or in composition, on moving across the total thickness of the foil, to achieve advantageous results. One exemplary composite reactive multilayer foil comprises a first section with a plurality of relatively thick reactive layers, e.g. 1 $\mu$m to 10 $\mu$m, stacked on a second section with a plurality of thinner reactive layers (e.g. 1–1000 nm). The section with the thinner reactive layers ignites more rapidly than would the section with the thicker reactive layers. But as ignition spreads across the thinner section, it ignites the thicker section to produce a more uniform ignition and higher heat. Similar results can be achieved by variation of the foil composition in the thickness direction. Compositional variations can provide one set of layers whose reaction product provides joining material and another set of more reactive layers for igniting the first set. Compositional variations can be achieved, for example, by varying the process parameters in vapor depositing in accordance with techniques well known in the art.

A fourth type of novel reactive foil has a major surface area composed of at least two different regions: one or more first regions which will react to form electrically conductive material and one or more second regions which are non-conductive. Such foils are particularly useful in connecting semiconductor device electrical contacts to a substrate having receiving contacts. A foil can be disposed between the device and the substrate with the device contacts, the contacts of the substrate and the first regions of the foil all in registration. The device and substrate are then pressed against the foil, and the foil is ignited to bond the device to the substrate with the respective contacts conductively connected and the other regions non-conductively bonded.

While preferred embodiments of the invention have been described and illustrated, it should be apparent that many modifications to the embodiments and implementations of the invention can be made without departing from the spirit or scope of the invention. While the illustrated embodiments have been described generically referring to the joining of bulk materials, it should be readily apparent that any materials that are to be coupled (permanently or temporarily) together through soldering, brazing, welding or other known technique can be coupled together utilizing the invention. Materials such as metallic glasses (e.g., amorphous glass), metals (e.g., Cu) and alloys (e.g., stainless steel), polymers, ceramics (e.g. SiC), composites, semiconductors, and numerous others in various combinations. The scope made available as a direct result of the advantages derived by joining materials utilizing the invention range from large scale bonding of SiC armor to Ti—Al—V tank bodies, or the bonding of carbide coatings to tool bits, to microscopic bonding of microchips to circuit boards on a nano or microscale.

The stimulus used to initiate the self-sustaining reaction in the reactive foils of the preferred embodiments may be any form of energy such as the impact from a sharp stylus, spark from an electrical source, heat from a filament, radiation from a laser, etc. Although the illustrated embodiments have been described as applied in an environment of air at room temperature, it should be readily apparent that the invention may be practiced in other environments including vacuum, argon, water, etc.

It should be readily apparent that the quantitative data (e.g., reaction velocity, peak temperature, heating rate, etc.) of particular embodiments may easily be modified by varying elements of the reaction (e.g., varying composition of materials A or B, thickness of layers, total thickness of foil, or braze layer composition/thickness).

Figure 2:
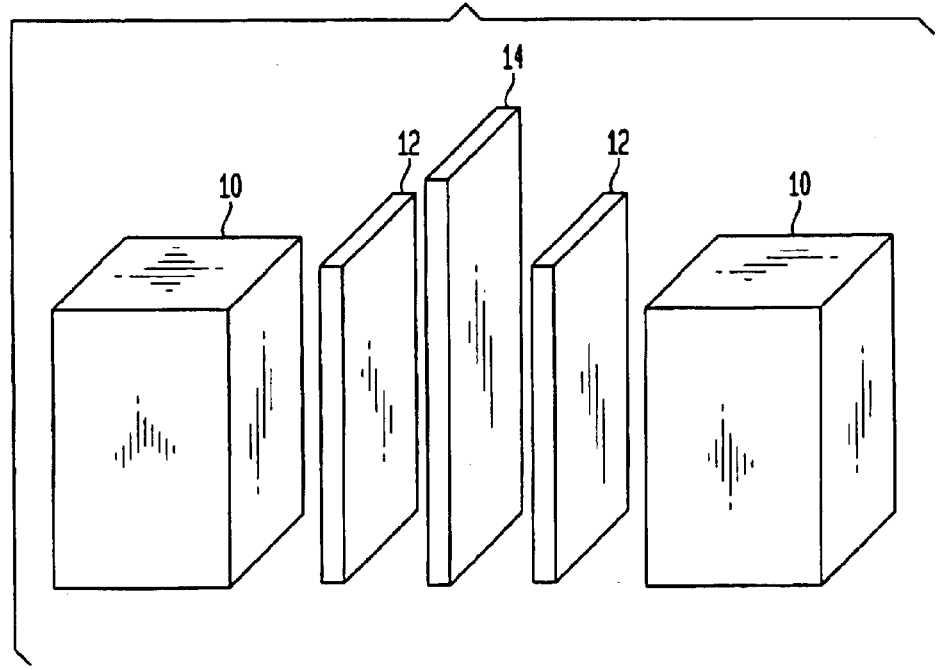
FIG. 2 shows the freestanding elements of an exemplary joining application.

Although the embodiments specifically illustrated herein depict joining materials in the form of two sheets forming a sandwich around a reactive foil (as shown, for example, by sheets 12 and foil 14 in FIGS. 2 and 3), it should be apparent that any number of sheets (or other structures) of joining materials may be used, including a single layer wrapped around reactive foil 14 or joining materials attached to the bulk components. In accordance with a preferred embodiment, no layer of joining material at all may also be used. For example, metallic glass bulk material, metallic glass reactive foils, or both may be used in joining applications without the use of joining material (e.g., braze).

Moreover, although the illustrated embodiments have only utilized two different materials A/B as alternating layers in a reactive foil, it should be apparent that any number of material layers can be utilized to form a reactive foil in accordance with the invention.

In addition, many of the preferred embodiments disclosed herein (e.g., patterning foils, perforations in the foil, etc.) make particular use of freestanding foils, it should be readily apparent, however, that these embodiments and other aspects of the invention may be implemented without use of freestanding foils. Furthermore, it should be readily apparent that the intentionally designed openings in the reactive foil surface may penetrate through any number of layers in the foil, although it is preferred that the entire foil structure be penetrated as shown, for example, in FIG. 5. The openings, while depicted in FIG. 4 as circle-shaped holes 22, may be any single (or combination) of shapes forming one or more patterned structures on the reactive foil. The openings may be formed vertically in the direction normal to the layers of the reactive foil, or be formed at one or more angles through the layers of the foil.

Thus numerous and varied other arrangements can be made by those skilled in the art without departing from the spirit and scope of the invention.

What is claimed:

1. A reactive multilayer foil comprising:

a multilayer foil having an area composed of at least two different regions, one or more first regions composed of layers that can react exothermically to form electrically conductive material and one or more second regions which are non-conductive or react to form non-conductive material.

* * * * *